United States Patent
Baik et al.

(10) Patent No.: US 8,633,375 B2
(45) Date of Patent: Jan. 21, 2014

(54) SOLAR CELL AND METHOD FOR MANUFACTURING THE SAME

(75) Inventors: Ihn Gee Baik, Seongnam-si (KR); Yun Gi Kim, Yongin-si (KR); Jin Wook Lee, Suwon-si (KR); Jin-Soo Mun, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 180 days.

(21) Appl. No.: 13/165,058

(22) Filed: Jun. 21, 2011

(65) Prior Publication Data

US 2012/0167974 A1    Jul. 5, 2012

(30) Foreign Application Priority Data

Dec. 29, 2010 (KR) .................. 10-2010-0137417

(51) Int. Cl.
*H01L 31/00* (2006.01)
*H01L 21/00* (2006.01)

(52) U.S. Cl.
USPC ................................. 136/256; 438/71; 438/98

(58) Field of Classification Search
CPC .................. H01L 31/02241; H01L 31/02363; H01L 31/0516; H01L 31/0682
USPC ................................. 136/255, 256; 438/71, 98
See application file for complete search history.

(56) References Cited

U.S. PATENT DOCUMENTS

| | | | |
|---|---|---|---|
| 6,274,402 B1 * | 8/2001 | Verlinden et al. | 438/98 |
| 7,217,883 B2 | 5/2007 | Munzer | |
| 2004/0112426 A1 * | 6/2004 | Hagino | 136/261 |
| 2004/0200520 A1 | 10/2004 | Mulligan et al. | |
| 2005/0016585 A1 | 1/2005 | Munzer | |
| 2010/0059109 A1 | 3/2010 | Nakayashiki et al. | |
| 2010/0206369 A1 | 8/2010 | Kim et al. | |

FOREIGN PATENT DOCUMENTS

| | | |
|---|---|---|
| JP | 05075149 | 3/1993 |
| JP | 10229210 A | 8/1998 |
| JP | 2007059644 A | 3/2007 |
| JP | 2010067972 A | 3/2010 |
| KR | 1020100092746 | 8/2010 |

* cited by examiner

*Primary Examiner* — Eli Mekhlin
(74) *Attorney, Agent, or Firm* — Harness, Dickey & Pierce, P.L.C.

(57) ABSTRACT

A solar cell and method of manufacturing the same includes a semiconductor substrate having a textured surface and including a plurality of recess portions and a plurality of flat portions, an emitter layer in the plurality of recess portions, a first doping region in at least one of the plurality of flat portions, and doped with a first conductive type impurity selected from one of p-type and n-type impurities, a second doping region in at least one of the plurality of flat portions, and doped with a second conductive type impurity selected from one of p-type and n-type impurities that differs from the first conductive type impurity, and first and second electrodes electrically connected to the first and second doping regions, respectively. The distance between the emitter layer and the first doping region is different from the distance between the emitter layer and the second doping region.

19 Claims, 6 Drawing Sheets

SOLAR CELL AND METHOD FOR MANUFACTURING THE SAME

CROSS-REFERENCE TO RELATED APPLICATION

This application claims priority to and the benefit of Korean Patent Application No. 10-2010-0137417 filed in the Korean Intellectual Property Office on Dec. 29, 2010, the entire contents of which are incorporated herein by reference.

BACKGROUND

1. Field

Example embodiments relate to a solar cell and a method of manufacturing the same.

2. Description of the Related Art

A solar cell is a photoelectric conversion device that transforms solar energy into electrical energy, and has attracted much attention as an infinite but pollution-free next generation energy source.

A solar cell may include p-type and n-type semiconductors, and may produce electrical energy by respectively transferring electrons and holes to the n-type and p-type semiconductors and collecting electrons and holes in each electrode when an electron-hole pair (EHP) is produced by solar light energy absorbed in a photoactive layer inside the semiconductors. In order to obtain electrical energy of a solar cell, the solar cell may effectively absorb light and collect a charge produced by the absorbed light.

SUMMARY

Example embodiments provide a solar cell having improved efficiency by decreasing charge loss and a method of manufacturing the solar cell.

According to example embodiments, a solar cell may include a semiconductor substrate having a textured surface, the semiconductor substrate including a plurality of recess portions and a plurality of flat portions; an emitter layer in the plurality of recess portions of the semiconductor substrate; a first doping region in at least one of the plurality of flat portions of the semiconductor substrate, the first doping region doped with a first conductive type impurity selected from one of p-type and n-type impurities; a second doping region in at least one of the plurality of flat portions of the semiconductor substrate, the second doping region doped with a second conductive type impurity selected from one of p-type and n-type impurities that differs from the first conductive type impurity; a first electrode electrically connected to the first doping region; and a second electrode electrically connected to the second doping region, wherein the distance between the emitter layer and the first doping region is different from the distance between the emitter layer and the second doping region.

The semiconductor substrate may be doped with a first conductive type impurity, and the emitter layer may be doped with a second conductive type impurity. The distance between the emitter layer and the first doping region may be larger than the distance between the emitter layer and the second doping region. The solar cell may further include an insulation layer on the plurality of flat portions of the semiconductor substrate, wherein the insulation layer includes a first portion surrounding the first doping region and a second portion surrounding the second doping region, the first and second portions having different widths.

The first portion of the insulation layer may have a width that is substantially equivalent to the distance between the emitter layer and the first doping region, and the second portion of the insulation layer may have a width that is substantially equivalent to the distance between the emitter layer and the second doping region. The first portion of the insulation layer may have a larger width than that of the second portion of the insulation layer. The plurality of recess portions may be shaped as an inverted pyramid.

The emitter layer may be substantially symmetrical along the sidewall of the plurality of recess portions with the inverted pyramid shape. The semiconductor substrate may be formed by alternately arranging the plurality of flat portions with different widths. The plurality of recess portions and the plurality of flat portions of the semiconductor substrate may be alternately arranged. The first and second electrodes may be on a same surface of the semiconductor substrate.

According to example embodiments, a solar cell may include first and second doping regions alternately disposed in a front side of a semiconductor substrate, the first and second doping regions being doped with different conductive type impurities; a first electrode electrically connected to the first doping region; and a second electrode electrically connected to the second doping region, wherein the front side of the semiconductor substrate includes a plurality of recess portions that are surface-textured into an inverted pyramid shape, a first flat portion between adjacent portions of the plurality of recess portions and having a first width, and a second flat portion between the adjacent portions of the plurality of recess portions and having a second width.

The solar cell may further include an emitter layer in the plurality of recess portions that are surface-textured in the inverted pyramid shape, wherein the distance between the emitter layer and the first doping region is different from the distance between the emitter layer and the second doping region. The semiconductor substrate may be doped with the same conductive impurity as the first doping region in a lower concentration than the first doping region, the emitter layer may be doped with the same conductive impurity as the second doping region in a lower concentration than the second doping region, and the distance between the emitter layer and the first doping region may be larger than the distance between the emitter layer and the second doping region.

According to example embodiments, a method of manufacturing a solar cell may include surface-texturing one side of a semiconductor substrate to form a plurality of recess portions and a plurality of flat portions, the plurality of recess portions doped with a first conductive type impurity selected from one of p-type and n-type impurities; forming an emitter layer doped with a second conductive type impurity selected from one of p-type and n-type impurities and different from the first conductive type in the plurality of recess portions; forming first and second doping regions in the plurality of flat portions, the first doping region doped with the first conductive type impurity in a higher concentration than the semiconductor substrate and a second doping region doped with the second conductive type impurity in a higher concentration than the emitter layer; forming a first electrode electrically connected to the first doping region; and forming a second electrode electrically connected to the second doping region, wherein the distance between the emitter layer and the first doping region differs from the distance between the emitter layer and the second doping region.

The distance between the emitter layer and the first doping region may be larger than the distance between the emitter layer and the second doping region. Surface-texturing the one side of the semiconductor substrate may include forming an insulation layer on the one side of the semiconductor substrate, patterning the insulation layer to form an opening for the plurality of recess portions, and etching the semiconductor substrate using the patterned insulation layer to form the plurality of recess portions with an inverted pyramid shape. Patterning the insulation layer may include forming an opening between first and second portions of the insulation layer with different widths.

Forming the emitter layer may include injecting the second conductive type impurity using the patterned insulation layer as a mask. Forming the first and second doping regions may include forming an opening for the first doping region in the patterned insulation layer; injecting the first conductive type impurity into the opening for the first doping region; forming an opening for the second doping region in the patterned insulation layer; and injecting the second conductive type impurity into the opening for the second doping region.

BRIEF DESCRIPTION OF THE DRAWINGS

These and/or other aspects will become apparent and more readily appreciated from the following description of example embodiments, taken in conjunction with the accompanying drawings of which.

DETAILED DESCRIPTION

Figure 1:
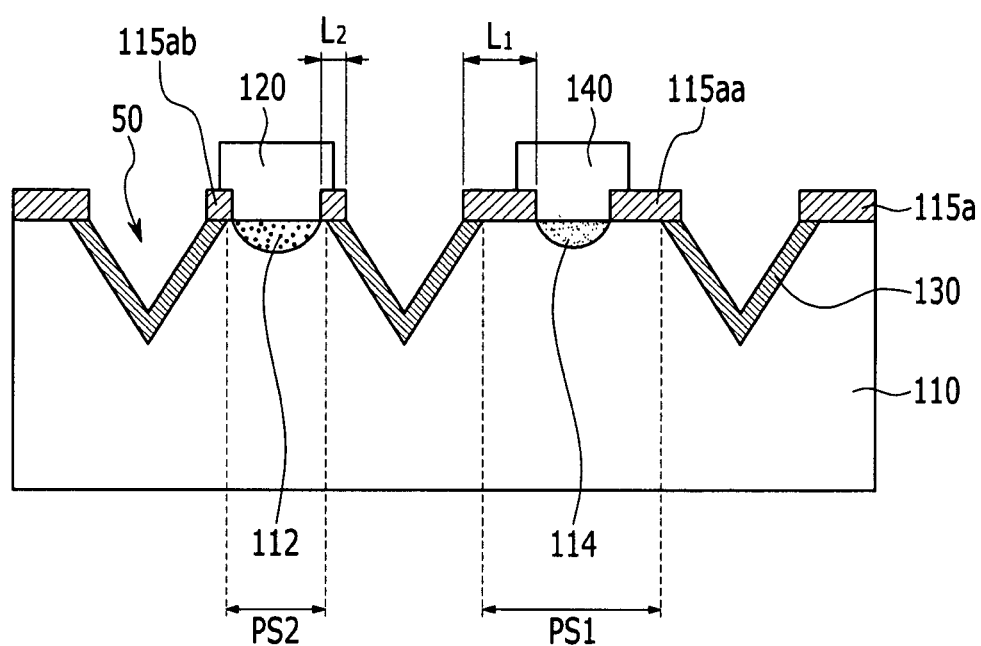
FIG. 1 is a cross-sectional view of a solar cell according to example embodiments.

Example embodiments will hereinafter be described in detail referring to the following accompanied drawings, and can be easily performed by those who have common knowledge in the related art. However, these example embodiments are not limited thereto.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, the location of top and bottom portions referring to one side of a semiconductor substrate 110 is illustrated for better understanding and easier description, but the location may be different in a different view. In addition, one side of the semiconductor substrate receiving solar energy is called a front side, and the other opposite side is called a rear side.

A solar cell according to example embodiments is illustrated, referring to FIG. 1. FIG. 1 is a cross-sectional view showing a solar cell according to example embodiments. The solar cell according to example embodiments may include a semiconductor substrate 110, an emitter layer 130, a first doping region 114, a second doping region 112, an insulation layer 115a, a first electrode 140, and a second electrode 120.

The semiconductor substrate 110 may be formed of crystalline silicon or a compound semiconductor. If it is formed of crystalline silicon, as an example, a silicon wafer may be used. The semiconductor substrate 110 may be doped with p-type or n-type impurities at a lower concentration. Herein, the p-type impurities may be a Group III compound, e.g., boron (B), and the n-type impurities may be a Group V compound, e.g., phosphorus (P). The semiconductor substrate 110 may be doped at a concentration of about $10^{14}/cm^3$ to $10^{16}/cm^3$.

The front side of the semiconductor substrate 110 may be surface textured. The surface-textured semiconductor substrate 110 may increase the surface area to increase the light absorption rate and reduce reflectance, thereby improving solar cell efficiency.

The front side of the semiconductor substrate 110 may have a plurality of recess portions 50 having an inverted pyramid shape through surface texturization. The plurality of recess portions 50 may be positioned at predetermined or given intervals. Between the neighboring recess portions 50 are first and second flat surface regions PS1 and PS2. For example, as shown in FIG. 1, the first flat portion PS1 may have a larger width than the second flat portion PS2. The first and second flat portions PS1 and PS2 may be alternately disposed. The semiconductor substrate 110 may include the emitter layer 130 on the recess portions 50.

The emitter layer 130 may be doped with p-type or n-type impurities at a lower concentration, which are conductive impurities of a different type from the semiconductor substrate 110. For example, the semiconductor substrate 110 may be doped with p-type impurities at a lower concentration, and the emitter layer 130 may be doped with n-type impurities at a lower concentration. The emitter layer 130 may be doped at a concentration of, for example about $10^{14}/cm^3$ to about $10^{16}/cm^3$.

The emitter layer 130 may act as a path for transferring a charge produced from the photoactive layer of the semiconductor substrate 110 to a following electrode. For example, when an emitter layer 130 is doped with n-type impurities, the emitter layer 130 may be a path through which electrons produced from an active layer move. The emitter layer 130 may be shaped as an inverted pyramid along the sidewall of the recess portion 50 and may be substantially symmetrical along the inverted pyramid shape. The emitter layer 130 may be formed at a thickness ranging from about 200 Å to about 1000 Å, for example, about 300 Å to about 500 Å.

The first doping region 114 may be formed in the first flat portion PS1 of the semiconductor substrate 110. The first doping region 114 may be doped with p-type or n-type impurities (p+ or n+) in a higher concentration, which are the same conductive type impurities as the semiconductor substrate 110 and different from the emitter layer 130. For example, the semiconductor substrate 110 and the first doping region 114 may be doped with p-type impurities while the emitter layer 130 may be doped with n-type impurities.

The second doping region 112 may be formed in the second flat portion PS2 of the semiconductor substrate 110. The second doping region 112 may be doped with p-type or n-type impurities (p+ or n+) in a higher concentration, which is different from the impurities doped in the semiconductor substrate 110 and the first doping region 114 but the same as the emitter layer 130. For example, the semiconductor substrate 110 and the first doping region 114 may be doped with p-type impurities, while the emitter layer 130 and the second doping region 112 may be doped with n-type impurities. The first doping region 114 and the second doping region 112 may be respectively doped, for example, in a concentration of about $10^{18}/cm^3$ to about $10^{19}/cm^3$.

Herein, the distance between the emitter layer 130 and the first doping region 114 differs from the distance between the emitter layer 130 and the second doping region 112. In other words, the distance between the emitter layer 130 and the first doping region 114 doped with different conductive type impurities may be larger than the distance between the emitter layer 130 and the second doping region 112 doped with the same conductive type impurity. For example, the distance between the emitter layer 130 and the first doping region 114 may be about 10 times to about 50 times larger than the distance between the emitter layer 130 and the second doping region 112.

As shown in FIG. 1, a semiconductor substrate 110 doped with the same conductive type as the first doping region 114 in a lower concentration than the first doping region 114 may be disposed between the emitter layer 130 and the first doping region 114.

For example, when the semiconductor substrate 110 is doped with p-type impurities (p−) in a low concentration, the first doping region 114 is doped with p-type impurities (p+) in a high concentration, and the emitter layer 130 is doped with n-type impurities (n−) in a low concentration. The emitter layer 130, the semiconductor layer 110, and the second doping region 112 may be disposed sequentially. Accordingly, an n-doping region, a p-doping region, and a p+ doping region may be disposed in order.

When the n− doping region and the p+ doping region are separated from each other and include a p− doping region therebetween, the p− doping region may prevent or reduce contact between the n− doped emitter layer 130 and the p+ doped second doping region 112 and accordingly from narrowing a depletion region between the n− doped emitter layer 130 and the p+ doped second doping region 112, thereby decreasing a leakage current.

The n− and p+ doping regions may be variously separated. For example, the flat surface regions of the semiconductor substrate 110 at both sides of the emitter layer 130 may have different widths and thus control the distance between the n− doping region and p+ doping region as mentioned previously.

The insulation layer 115a may be disposed on the first and the second flat portions PS1 and PS2 of the semiconductor substrate 110. The insulation layer 115a may act as an anti-reflective coating (ARC), for example, decreasing reflectance of light and increasing selectivity of light in a particular wavelength region as well as improving the contact characteristic with silicon on the surface of the semiconductor substrate 110, and thus may increase efficiency of a solar cell. The insulation layer 115a may be made of a silicon oxide, a silicon nitride, or a combination thereof in a single layer or a multi-layer.

The insulation layer 115a may include the first portion 115aa on the first flat portion PS1 and the second portion 115ab on the second flat portion PS2. The first and second portions 115aa and 115ab of the insulation layer 115a may be positioned at both sides of the recess portion 50.

The first and second portions 115aa and 115ab of the insulation layer 115a may have a width that is determined depending on the widths of the first flat portion PS1 and the second flat portion PS2. For example, as shown in FIG. 1, when the first flat portion PS1 has a larger width than the second flat portion PS2, the first portion 115aa of the insulation layer 115a on the first flat portion PS1 may have a larger width than the second portion 115ab of the insulation layer 115a on the second flat portion PS2.

The first portion 115aa of the insulation layer 115a may have an opening exposing the first doping region 114, while the second portion 115ab of the insulation layer 115a may have an opening exposing the second doping region 112.

Herein, the first portion 115aa of the insulation layer 115a surrounding the first doping region 114 may have a width (L1) that is substantially equivalent to the distance between the emitter layer 130 and the first region 114. The second portion 115ab of the insulation layer 115a surrounding the second doping region 112 may have a width (L2) that is substantially equivalent to the distance between the emitter layer 130 and the second region 112. Accordingly, the first portion 115aa of the insulation layer 115a surrounding the first doping region 114 may have a larger width (L1) than the width (L2) of the second portion 115ab of the insulation layer 115a surrounding the second doping region 112. For example, the first portion 115a of the insulation layer 115a surrounding the first doping region 114 may have an about 10 times to about 50 times larger width (L1) than the width (L2) of the second portion 115ab of the insulation layer 115a surrounding the second doping region 112.

The first electrode 140 may be disposed on the first flat portion PS1 of the semiconductor substrate 110. The first electrode 140 may be electrically connected to the first doping region 114 through the opening of the insulation layer 115a. Likewise, the second electrode 120 may be disposed on the second flat portion PS2 of the semiconductor substrate 110. The second electrode 120 may be electrically connected to the second doping region 112 through the opening of the insulation layer 115a. The first electrode 140 and the second electrode 120 may have, for example, a finer width ranging from about 1 to about 10 μm.

When the photoactive layer of the semiconductor substrate 110 absorbs solar energy, the produced holes may be collected in the first electrode 140 through the first doping region 114, while the electrons may be collected in the second electrode 120 through the second doping region 112.

Hereinafter, referring to FIGS. 2 to 9 as well as FIG. 1, a method of manufacturing a solar cell according to example embodiments is illustrated. FIGS. 2 to 9 provide cross-sectional views sequentially showing a method of manufacturing a solar cell according to example embodiments.

Figure 2:
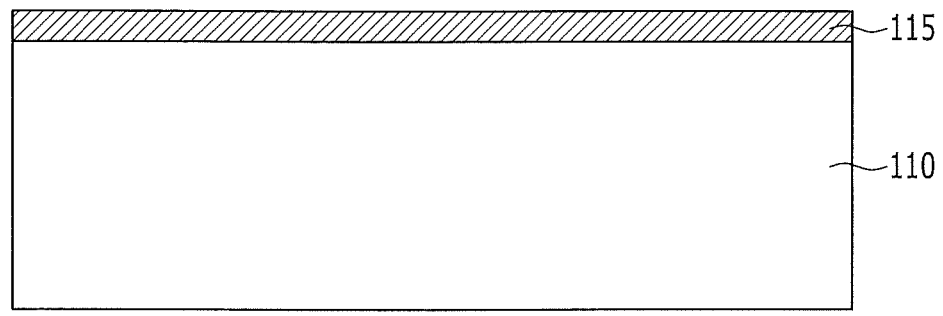
FIGS. 2 to 9 are cross-sectional views sequentially showing a method of manufacturing a solar cell according to example embodiments.

A semiconductor substrate 110 doped with p-type or n-type impurities may be prepared. Referring to FIG. 2, an insulation layer 115 may be disposed on the semiconductor substrate 110. The insulation layer 115 may be formed by disposing a silicon oxide or silicon nitride in a thermal oxidation method or in a chemical vapor deposition (CVD) method.

Figure 3:
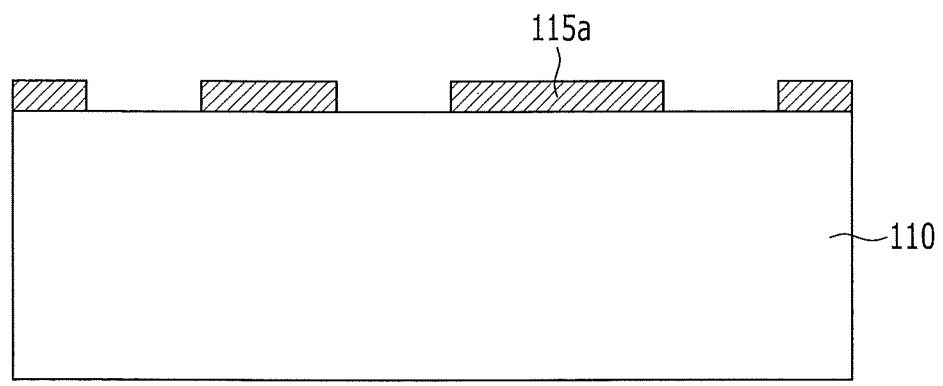

Referring to FIG. 3, the insulation layer 115 may be patterned to expose a part of the semiconductor substrate 110 and form a patterned insulation layer 115a. Herein, the patterned insulation layer 115a may have a plurality of openings arranged along a row or column direction. The patterned insulation layer 115a may have first and second portions 115aa and 115ab with a predetermined or given width at both sides of the opening. The first portion 115aa of the insulation layer 115a may be disposed on the first flat portion PS1 of the semiconductor substrate 110 (see FIG. 1), while the second portion 115ab of the insulation layer 115a may be disposed on the second flat portion PS2 of the semiconductor substrate 110 (see FIG. 1).

Figure 4:
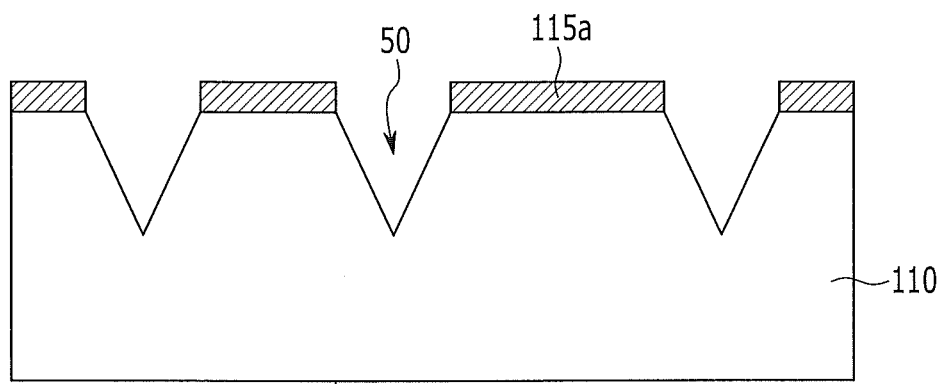

Referring to FIG. 4, the patterned insulation layer 115a may be used as a mask to surface-texture the semiconductor substrate 110 and may form a plurality of recess portions 50. The plurality of recess portions 50 may have an inverted pyramid shape.

Figure 5:
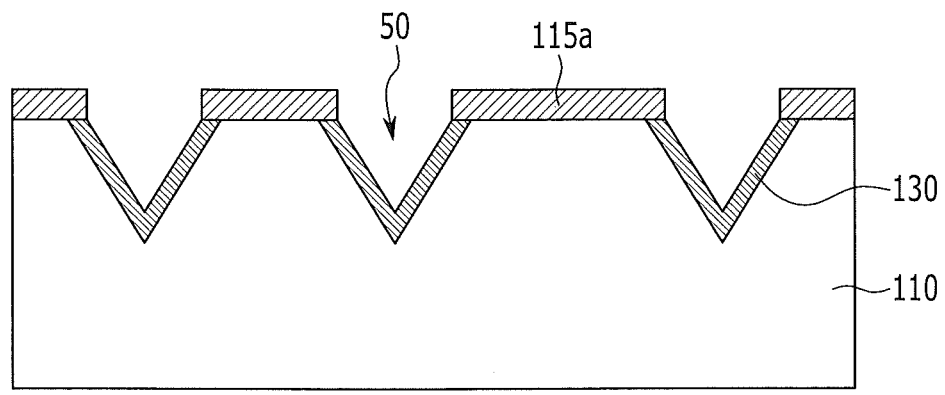

Referring to FIG. 5, an emitter layer 130 may be formed by using the patterned insulation layer 115a as a mask and injecting impurities into the recess portions 50 with the inverted pyramid shape. The emitter layer 130 may be doped with impurities of a different conductive type from the semiconductor substrate 110. For example, when the semiconductor substrate 110 is doped with p-type impurities, the emitter layer 130 may be doped with n-type impurities. The emitter layer 130 may be formed symmetrically along the sidewall with an inverted pyramid shape.

Figure 6:
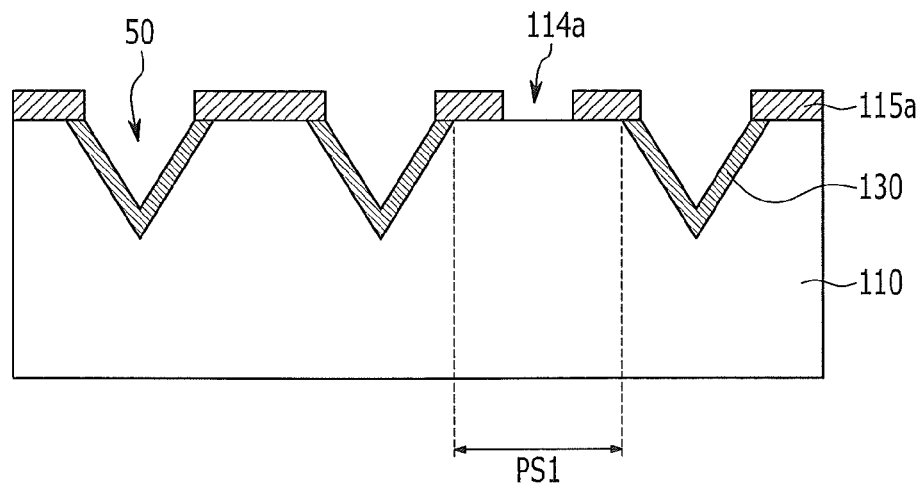

Referring to FIG. 6, the patterned insulation layer 115a corresponding to the first flat portion PS1 (see FIG. 1) may be patterned again to form an opening 114a for the first doping region 114. The opening 114a may be formed by, for example, disposing a photosensitive layer (not shown) on a semiconductor substrate 110, removing the photosensitive layer on a portion of the opening 114a, and using a photosensitive layer as a mask to etch the patterned insulation layer 115a.

Figure 7:
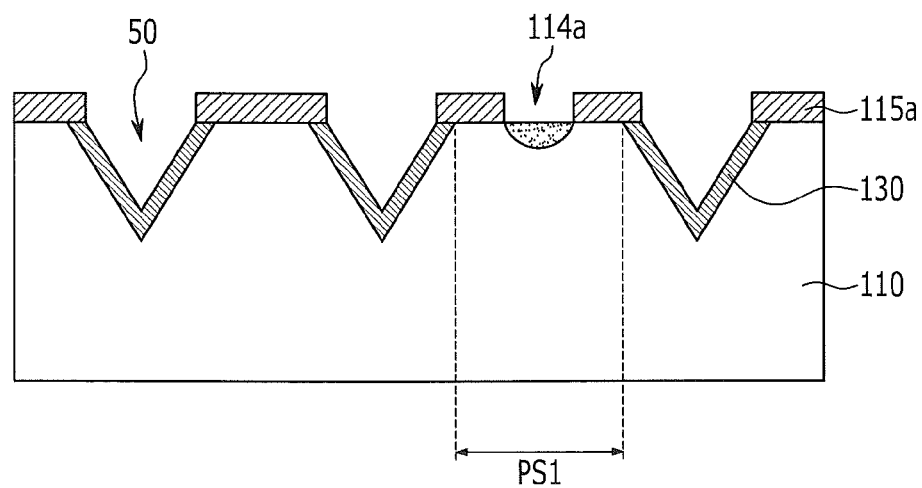

Referring to FIG. 7, the first doping region 114 may be formed by injecting impurities in a high concentration into the opening 114a. Herein, the first doping region 114 may be doped with the same conductive type impurity as the semiconductor substrate 110 but a different conductive type impurity from the emitter layer 130. For example, the semiconductor substrate 110 and the first doping region 114 may be doped with p-type impurities, while the emitter layer 130 may be doped with n-type impurities.

Figure 8:
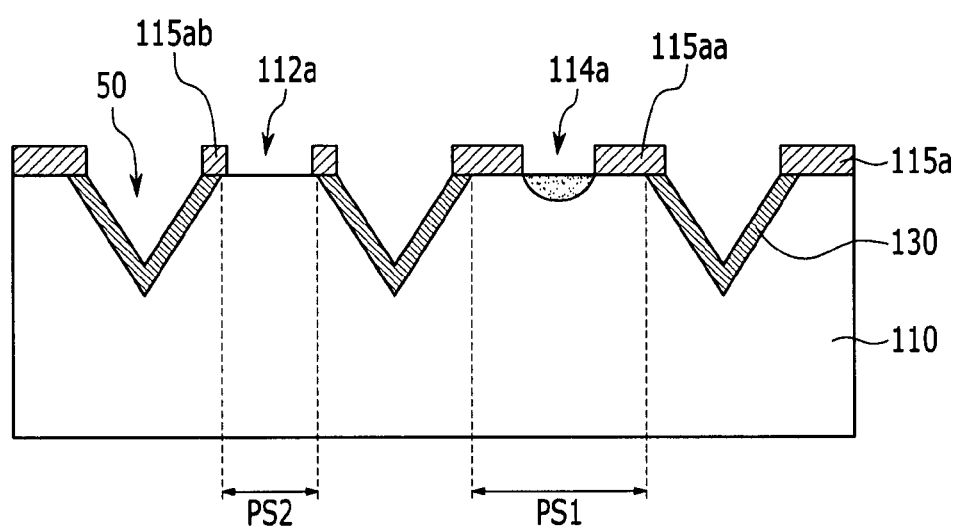

Referring to FIG. 8, the patterned insulation layer 115a on the second flat portion PS2 may be patterned again to form an opening 112a for the second doping region 112. The opening 112a may be formed by, for example, disposing a photosensitive layer (not shown) on the semiconductor substrate 110, removing the photosensitive layer on a portion of the opening 112a, and using the photosensitive layer as a mask to etch the patterned insulation layer 115a.

Figure 9:
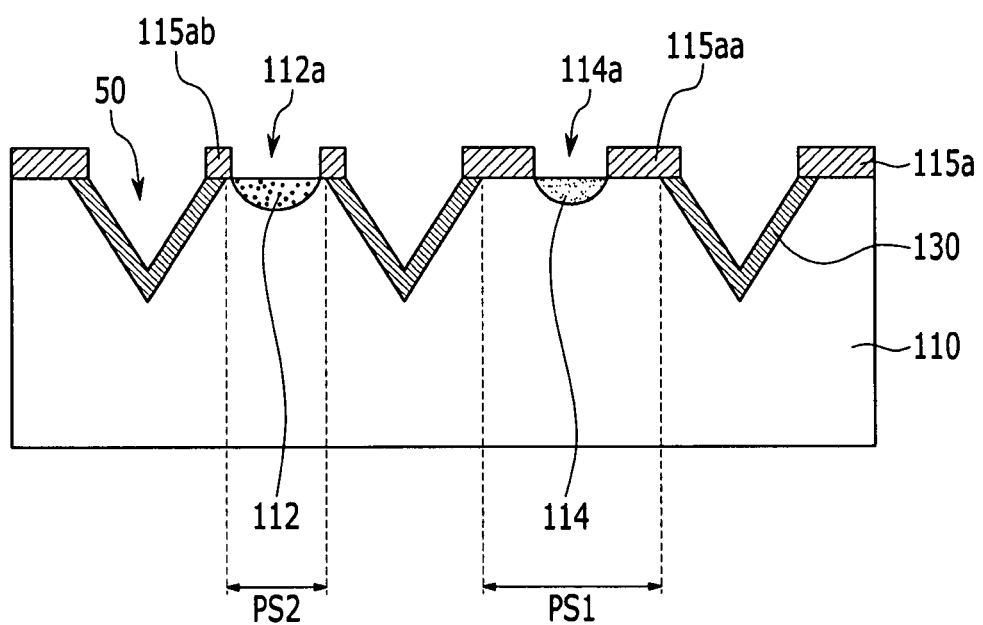

Referring to FIG. 9, the second doping region 112 may be formed by injecting impurities in a higher concentration into the opening 112a. Herein, the second doping region 112 may be doped with a different conductive type impurity from the semiconductor substrate 110 and the first doping region 114 but the same conductive type impurity as the emitter layer 130. For example, the semiconductor substrate 110 and the first doping region 114 may be doped with p-type impurities, while the emitter layer 130 and the second doping region 112 may be doped with n-type impurities.

Referring to FIG. 1, the first electrode 140 may be disposed on the first flat portion PS1 of the semiconductor substrate 110, and the second electrode 120 may be disposed on the second flat portion PS2 of the semiconductor substrate 110. Herein, the first electrode 140 may contact the first doping region 114 through the opening 114a. The second electrode 120 may contact the second doping region 112 through the opening 112a.

Accordingly, when the semiconductor substrate 110 absorbs solar energy through the photoactive layer and produces holes, the holes may be collected through the first doping region 114 in the first electrode 140, while electrons are collected through the second doping region 112 in the second electrode 120.

Herein, a solar cell with a front contact structure in which first and second electrodes 120 and 140 are positioned on the front side of a semiconductor substrate is illustrated. However, example embodiments are not limited thereto, but may be applied to a solar cell with a back contact structure in which first and second electrodes 120 and 140 are positioned on different sides of a semiconductor substrate.

It should be understood that example embodiments described therein should be considered in a descriptive sense only and not for purposes of limitation. Descriptions of features or aspects within each example embodiment should typically be considered as available for other similar features or aspects in other embodiments.

What is claimed is:

1. A solar cell comprising:
a semiconductor substrate having a textured surface including a plurality of recess portions and a plurality of flat portions distinct from the plurality of recess portions, the plurality of flat portions including first and second flat portions having different widths;
an emitter layer in the plurality of recess portions of the semiconductor substrate;
a first doping region in the first flat portions of the semiconductor substrate, the first doping region doped with a first conductive type impurity selected from one of p-type and n-type impurities;
a second doping region in the second flat portions of the semiconductor substrate, the second doping region doped with a second conductive type impurity selected from one of p-type and n-type impurities that differs from the first conductive type impurity;
a first electrode electrically connected to the first doping region on the first flat portions; and
a second electrode electrically connected to the second doping region on the second flat portions,
wherein the distance between the emitter layer and the first doping region is different from the distance between the emitter layer and the second doping region.

2. The solar cell of claim 1, wherein the semiconductor substrate is doped with a first conductive type impurity, and
the emitter layer is doped with a second conductive type impurity.

3. The solar cell of claim 2, wherein the distance between the emitter layer and the first doping region is larger than the distance between the emitter layer and the second doping region.

4. The solar cell of claim 1, further comprising:
an insulation layer on the plurality of flat portions of the semiconductor substrate,
wherein the insulation layer includes a first portion surrounding the first doping region and a second portion surrounding the second doping region, the first and second portions having different widths.

5. The solar cell of claim 4, wherein the first portion of the insulation layer has a width that is equivalent to the distance between the emitter layer and the first doping region, and
the second portion of the insulation layer has a width that is equivalent to the distance between the emitter layer and the second doping region.

6. The solar cell of claim 4, wherein the first portion of the insulation layer has a larger width than that of the second portion of the insulation layer.

7. The solar cell of claim 1, wherein the plurality of recess portions are shaped as an inverted pyramid.

8. The solar cell of claim 7, wherein the emitter layer is symmetrical along the sidewall of the plurality of recess portions with the inverted pyramid shape.

9. The solar cell of claim 1, wherein the first flat portions and the second flat portions are alternately arranged.

10. The solar cell of claim 1, wherein the plurality of recess portions and the plurality of flat portions of the semiconductor substrate are alternately arranged.

11. The solar cell of claim 1, wherein the first and second electrodes are on a same surface of the semiconductor substrate.

12. A solar cell comprising:
a semiconductor substrate wherein a front side of the semiconductor substrate includes a plurality of recess portions that are surface textured into an inverted pyramid shape, a first flat portion between the plurality of recess portions having a first width, and a second flat portion between the plurality of recess portions having a second width different from the first width, wherein the first and second flat portions are distinct from the plurality of recess portions;
first and second doping regions alternately disposed in the front side of the semiconductor substrate, the first and second doping regions being doped with different conductive type impurities, wherein the first doping region is disposed in the first flat portion and the second doping region is disposed in the second flat portion;
a first electrode electrically connected to the first doping region;
a second electrode electrically connected to the second doping region; and
an emitter layer in the plurality of recess portions that are surface-textured in the inverted pyramid shape, wherein a distance between the emitter layer and the first doping region is different from a distance between the emitter layer and the second doping region.

13. The solar cell of claim 12, wherein the semiconductor substrate is doped with the same conductive impurity as the first doping region in a lower concentration than the first doping region, the emitter layer is doped with the same conductive impurity as the second doping region in a lower concentration than the second doping region, and the distance between the emitter layer and the first doping region is larger than the distance between the emitter layer and the second doping region.

14. A method of manufacturing a solar cell, comprising:
preparing a semiconductor substrate doped with a first conductive type impurity selected from one of p-type and n-type impurities;
surface-texturing one side of the semiconductor substrate to form a plurality of recess portions and a plurality of flat portions distinct from the plurality of recess portions, the plurality of flat portions including first and second flat portions having different widths;
forming an emitter layer in the plurality of recess portions, the emitter layer doped with a second conductive type impurity selected from one of p-type and n-type impurities and different from the first conductive type;
forming first and second doping regions in the first and second flat portions, respectively, the first doping region doped with the first conductive type impurity in a higher concentration than the semiconductor substrate and a second doping region doped with the second conductive type impurity in a higher concentration than the emitter layer;
forming a first electrode electrically connected to the first doping region on the first flat portions; and
forming a second electrode electrically connected to the second doping region on the second flat portions,
wherein the distance between the emitter layer and the first doping region differs from the distance between the emitter layer and the second doping region.

15. The method of claim 14, wherein the distance between the emitter layer and the first doping region is larger than the distance between the emitter layer and the second doping region.

16. The method of claim 14, wherein surface-texturing the one side of the semiconductor substrate comprises:
forming an insulation layer on the one side of the semiconductor substrate,
patterning the insulation layer to form an opening for the plurality of recess portions, and etching the semiconductor substrate using the patterned insulation layer to form the plurality of recess portions with an inverted pyramid shape.

17. The method of claim 16, wherein patterning the insulation layer comprises:
forming an opening between first and second portions of the insulation layer with different widths.

18. The method of claim 16, wherein forming the emitter layer comprises:
injecting the second conductive type impurity using the patterned insulation layer as a mask.

19. The method of claim 16, wherein forming the first and second doping regions comprises:
forming an opening for the first doping region in the patterned insulation layer;
injecting the first conductive type impurity into the opening for the first doping region;
forming an opening for the second doping region in the patterned insulation layer; and
injecting the second conductive type impurity into the opening for the second doping region.

* * * * *